United States Patent
Gilton (10) Patent No.: US 7,276,722 B2
(45) Date of Patent: *Oct. 2, 2007

(54) NON-VOLATILE MEMORY STRUCTURE (75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/143,729

(22) Filed: Jun. 3, 2005

(65) Prior Publication Data

US 2005/0219901 A1    Oct. 6, 2005

Related U.S. Application Data

(63) Continuation of application No. 10/663,741, filed on Sep. 17, 2003, now Pat. No. 6,903,361.

(51) Int. Cl.
*H01L 47/00* (2006.01)
*H01L 29/76* (2006.01)

(52) U.S. Cl. .......................... 257/2; 257/314

(58) Field of Classification Search .............. 257/2–4, 257/314–324, 24; 438/257–265
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |

(Continued)

FOREIGN PATENT DOCUMENTS

JP    56126916    10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Cuong Nguyen
(74) *Attorney, Agent, or Firm*—Dickstein Shapiro LLP (57) ABSTRACT

A non-volatile memory cell utilizes a programmable conductor random access memory (PCRAM) structure instead of a polysilicon layer for a floating gate. Instead of storing or removing electrons from a floating gate, the programmable conductor is switched between its low and high resistive states to operate the flash memory cell. The resulting cell can be erased faster and has better endurance than a conventional flash memory cell.

30 Claims, 9 Drawing Sheets

U.S. PATENT DOCUMENTS

| | | |
|---|---|---|
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,426,898 B1 | 7/2002 | Mihnea et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |

| | | | |
|---|---|---|---|
| 6,673,700 | B2 | 1/2004 | Dennison et al. |
| 6,674,115 | B2 | 1/2004 | Hudgens et al. |
| 6,687,153 | B2 | 2/2004 | Lowery |
| 6,687,427 | B2 | 2/2004 | Ramalingam et al. |
| 6,690,026 | B2 | 2/2004 | Peterson |
| 6,696,355 | B2 | 2/2004 | Dennison |
| 6,707,712 | B2 | 3/2004 | Lowery |
| 6,714,954 | B2 | 3/2004 | Ovshinsky et al. |
| 2002/0000666 | A1 | 1/2002 | Kozicki et al. |
| 2002/0072188 | A1 | 6/2002 | Gilton |
| 2002/0094640 | A1 | 7/2002 | Forbes |
| 2002/0101765 | A1 | 8/2002 | Mihnea et al. |
| 2002/0106849 | A1 | 8/2002 | Moore |
| 2002/0123169 | A1 | 9/2002 | Moore et al. |
| 2002/0123170 | A1 | 9/2002 | Moore et al. |
| 2002/0123248 | A1 | 9/2002 | Moore et al. |
| 2002/0126533 | A1 | 9/2002 | Kao |
| 2002/0127886 | A1 | 9/2002 | Moore et al. |
| 2002/0130351 | A1 | 9/2002 | Ghodsi |
| 2002/0132417 | A1 | 9/2002 | Li |
| 2002/0159292 | A1 | 10/2002 | Forbes |
| 2002/0160551 | A1 | 10/2002 | Harshfield |
| 2002/0163030 | A1 | 11/2002 | Mandell et al. |
| 2002/0163828 | A1 | 11/2002 | Krieger et al. |
| 2002/0168820 | A1 | 11/2002 | Kozicki |
| 2002/0168852 | A1 | 11/2002 | Harshfield et al. |
| 2002/0190289 | A1 | 12/2002 | Harshfield et al. |
| 2002/0190350 | A1 | 12/2002 | Kozicki et al. |
| 2003/0001229 | A1 | 1/2003 | Moore et al. |
| 2003/0027416 | A1 | 2/2003 | Moore |
| 2003/0032254 | A1 | 2/2003 | Gilton |
| 2003/0035314 | A1 | 2/2003 | Kozicki |
| 2003/0035315 | A1 | 2/2003 | Kozicki |
| 2003/0038301 | A1 | 2/2003 | Moore |
| 2003/0043631 | A1 | 3/2003 | Gilton et al. |
| 2003/0045049 | A1 | 3/2003 | Campbell et al. |
| 2003/0045054 | A1 | 3/2003 | Campbell et al. |
| 2003/0047765 | A1 | 3/2003 | Campbell |
| 2003/0047772 | A1 | 3/2003 | Li |
| 2003/0047773 | A1 | 3/2003 | Li |
| 2003/0048519 | A1 | 3/2003 | Kozicki |
| 2003/0048744 | A1 | 3/2003 | Ovshinsky et al. |
| 2003/0049912 | A1 | 3/2003 | Campbell et al. |
| 2003/0068861 | A1 | 4/2003 | Li |
| 2003/0068862 | A1 | 4/2003 | Li |
| 2003/0095426 | A1 | 5/2003 | Hush et al. |
| 2003/0096497 | A1 | 5/2003 | Moore et al. |
| 2003/0107105 | A1 | 6/2003 | Kozicki |
| 2003/0117831 | A1 | 6/2003 | Hush |
| 2003/0128612 | A1 | 7/2003 | Moore et al. |
| 2003/0137869 | A1 | 7/2003 | Kozicki |
| 2003/0143782 | A1 | 7/2003 | Gilton et al. |
| 2003/0155589 | A1 | 8/2003 | Campbell et al. |
| 2003/0155606 | A1 | 8/2003 | Campbell et al. |
| 2003/0156447 | A1 | 8/2003 | Kozicki |
| 2003/0156463 | A1 | 8/2003 | Casper et al. |
| 2003/0209728 | A1 | 11/2003 | Kozicki et al. |
| 2003/0209971 | A1 | 11/2003 | Kozicki et al. |
| 2003/0210564 | A1 | 11/2003 | Kozicki et al. |
| 2003/0212724 | A1 | 11/2003 | Ovshinsky et al. |
| 2003/0212725 | A1 | 11/2003 | Ovshinsky et al. |
| 2004/0035401 | A1 | 2/2004 | Ramachandran et al. |

FOREIGN PATENT DOCUMENTS

| | | |
|---|---|---|
| WO | WO97/48032 | 12/1997 |
| WO | WO99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 135-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 164-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=⅓ in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J. Molecular Structure of Melt-Quenched GeSe2 and GeS2 glasses compared, Proc. Int. Conf. Phys. Semicond. (Eds. Chadi and Harrison) $17_{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe 2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V. Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-GeSe, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21 Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose M.J.; Osborne, I.S.; Snell, A.J.; Le Comber, P.G.; Owen, A.E. Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan, J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybride resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title p.-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 134-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change inoptical transmission spectra resulting from Ag photodoping in chalcogenide film, Japn. J. Appl. Phys. 26 (1987) 15-21.

Kawasaki, M.; Kawamura, J.; Nakamura, Y.; Anlya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the orgin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A./ Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V205 based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose, M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G, On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35(1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Yoji Kawamoto et al., "Ionic Conduction in $As_2S_3$-$Ag_2S$, $GeS_2$-$GeS$-$Ag_2S$ and $P_2S_5$-$Ag_2S$ Glasses," Journal of Non-Crystalline Solids 20 (1976) 393-404.

NON-VOLATILE MEMORY STRUCTURE

This application is a continuing application of Application No. 10/663,741, filed Sep. 17, 2003 now U.S. Pat. No. 6,903,361 (now allowed), the subject matter of which is incorporated by reference herein.

FIELD OF THE INVENTION

The present invention relates to the field of semiconductor memory devices and, more particularly, to a flash memory device.

BACKGROUND OF THE INVENTION

A nonvolatile memory is a type of memory that retains stored data when power is removed. There are various types of nonvolatile memories including e.g., read only memories (ROMs), erasable programmable read only memories (EPROMs), and electrically erasable programmable read only memories (EEPROMs), and flash memory.

Flash memory is often used where regular access to the data stored in the memory device is desired, but where such data is seldom changed. For example, computers often use flash memory to store firmware (e.g., a personal computer's BIOS). Peripheral devices such as printers may store fonts and forms on flash memory. Wireless communications devices such as cellular and other wireless telephones use flash memory to store data and their operating systems. Portable electronics such as digital cameras, audio recorders, personal digital assistants (PDAs), and test equipment use flash memory cards as a storage medium.

Flash memory cells make use of a floating-gate covered with an insulating layer. There is also a control gate which overlays the insulating layer. Below the floating gate is another insulating layer sandwiched between the floating gate and the cell substrate. This insulating layer is an oxide layer and is often referred to as the tunnel oxide. The substrate contains doped source and drain regions, with a channel region disposed between the source and drain regions. The floating-gate transistors generally include n-channel floating-gate field-effect transistors, but may also include p-channel floating-gate field-effect transistors. Access operations are carried out by applying biases to the transistor.

In a flash memory device, cells are often organized into blocks and the charge state of the floating gate indicates the logical state of the cell. For example, a charged floating gate may represent a logical "1" while a non-charged floating gate may represent a logical "0." A flash memory cell may be programmed to a desired state by first erasing the cell to a logical "0" and, if necessary, writing the cell to a logical "1." Typically, flash memory devices are organized so that a write operation can target a specific cell while an erase operation affects an entire block of cells. Changing any portion of one block therefore requires erasing the entire block and writing those bits in the block which correspond to a logical "1".

Figure 1:
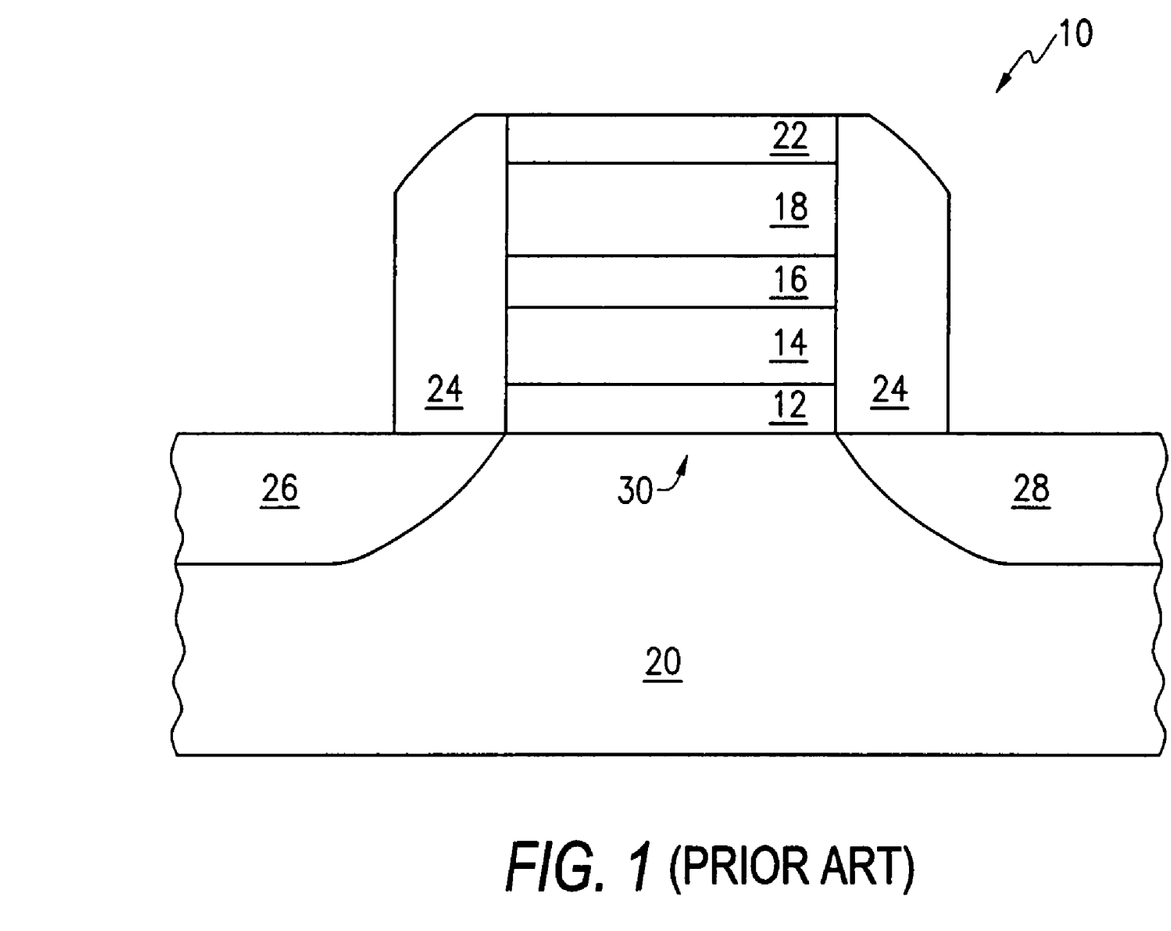
FIG. 1 is an illustration of a prior art flash memory cell.

Referring now to FIG. 1, a conventional flash memory cell 10 includes a source region 26 and a drain region 28. The source 26 and drain 28 have an N+ type conductivity formed in a P-type substrate 20. The memory cell 10 has a stack-gate configuration which includes a cap layer 22 formed over a control gate 18 formed over an insulating layer 16 formed over a floating gate 14 formed over a tunnel oxide layer 12. The floating gate 14 is formed of a first polysilicon layer and the control gate 18 is formed of a second polysilicon layer. The floating gate 14 is isolated from the control gate 18 by the insulating layer 16 and from a channel region 30 of the substrate 20 by the tunnel oxide layer 12. The tunnel oxide layer is generally about 100 Angstroms thick.

Figure 2:
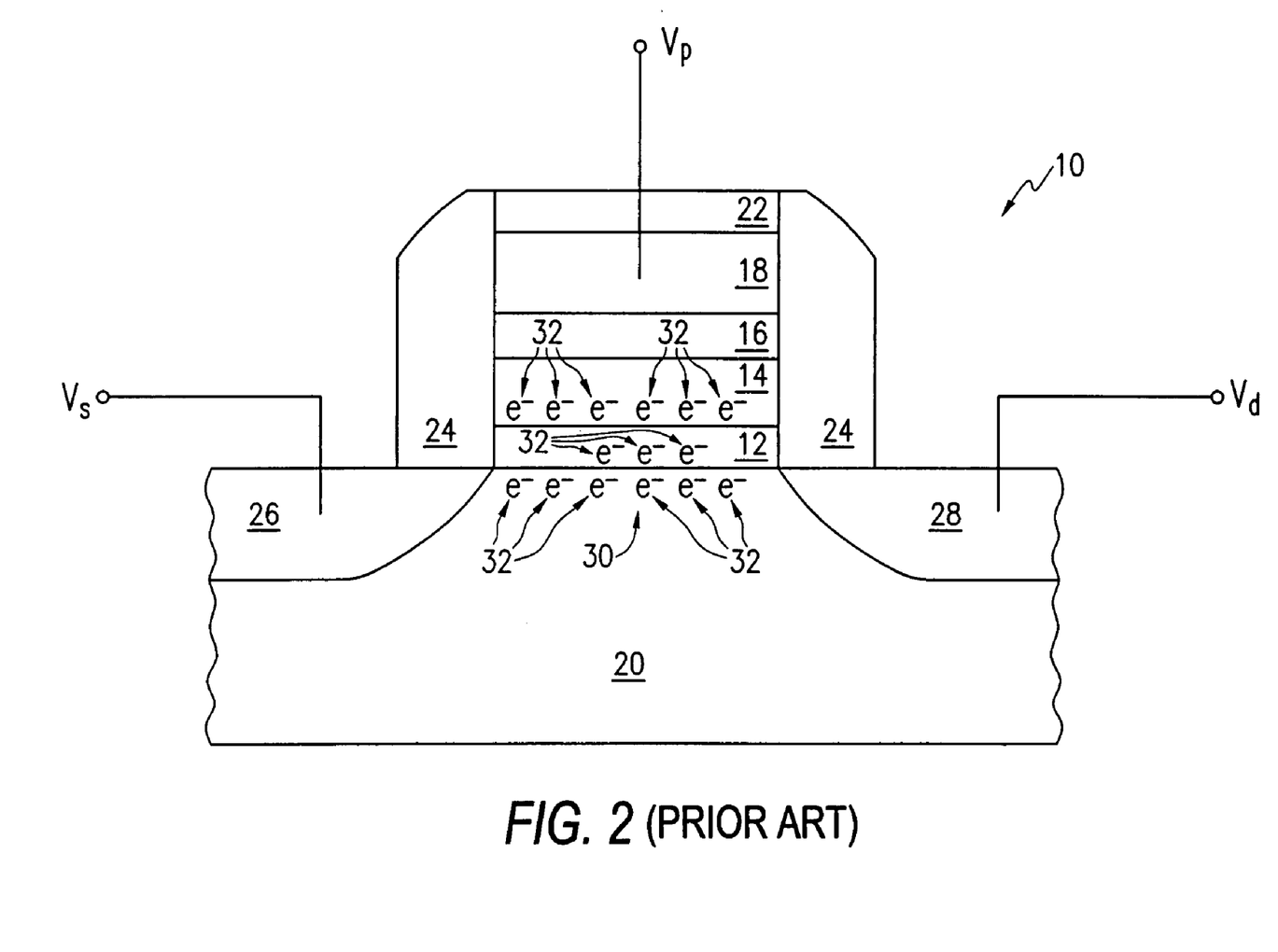
FIG. 2 is an illustration of how the prior art flash memory cell of FIG. 1 is programmed.

Referring now to FIG. 2, the conventional flash memory cell 10 is shown during a programming operation. A positive programming voltage Vp of, e.g., about 12 volts is applied to the control gate 18. The positive programming voltage Vp attracts electrons 32 from the P-type substrate 20 and causes them to accumulate at the surface of channel region 30. A voltage on drain 28 Vd is increased to, e.g., about 6 volts, and the source 26 is connected to ground Vs. As the drain-to-source voltage increases, electrons 32 flow from the source 26 to the drain 28 via channel region 30. As electrons 32 travel toward the drain 28, they acquire substantial high kinetic energy and are typically referred to as "hot" electrons.

The voltages at the control gate 18 and the drain 28 create an electric field in the oxide layer 12, which attracts the hot electrons and accelerates them toward the floating gate 14. At this point, the floating gate 14 begins to trap and accumulate the hot electrons. This is a charging process. As the charge on the floating gate 14 increases, the electric field in the oxide layer 12 decreases gradually and eventually loses its capability of attracting more hot electrons to the floating gate 14. At this point, the floating gate 14 is fully charged. The cell 10 will turn on when the voltage on the control gate 18 is brought to the threshold voltage level of the cell 10. Sense amplifiers are used in the memory to detect and amplify the state of the memory cell during a read operation.

Electrons are removed from the floating gate 14 to erase the memory cell. Fowler-Nordheim (FN) tunneling may be used to erase the memory cell 10. The erase procedure is accomplished by electrically floating the drain 28, grounding the source 26, and applying a high negative voltage (e.g., −12 volts) to the control gate 18. This creates an electric field across the tunnel oxide layer 12 and forces electrons off of the floating gate 14 and to then tunnel through the tunnel oxide layer 12 back to the substrate 20.

The erase operation requires high voltages and is relatively slow. The high erase voltages are a fundamental problem arising from the high electron affinity of bulk silicon or large grain polysilicon particles used as the floating gate. This creates a very high tunneling barrier. Even with high negative voltages applied to the gate, a large tunneling distance is experienced with a very low tunneling probability for electrons attempting to leave the floating gate. This results in long erase times since the net flux of electrons leaving the gate is low. Thus, the tunneling current discharging the gate is low. In addition, other phenomena result as a consequence of this very high negative voltage. Hole injection into the oxide is experienced which can result in erratic over erase, damage to the gate oxide itself, and the introduction of trapping states. Accordingly, there is a desire and need for a new flash memory cell architecture, which overcomes the aforementioned problems.

SUMMARY OF THE INVENTION

The present invention is directed to a flash memory cell in which the floating gate is implemented using a programmable conductance random access memory structure instead of the traditional polysilicon layer. Instead of storing or removing electrons from a polysilicon layer, the programmable conductance is switched between its low and high resistive states to operate the cell. The resulting cell can be erased faster and has better endurance (i.e., can withstand a greater number of erase/write cycles) than a conventional flash memory.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

In the following detailed description, reference is made to the accompanying drawings, which form a part hereof, and in which is shown by way, of illustration of specific embodiments in which the invention may be practiced. It is to be understood that other embodiments may be utilized, and that structural, logical and electrical changes may be made without departing from the spirit and scope of the present invention.

The terms "wafer" and "substrate" are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

Figure 3:
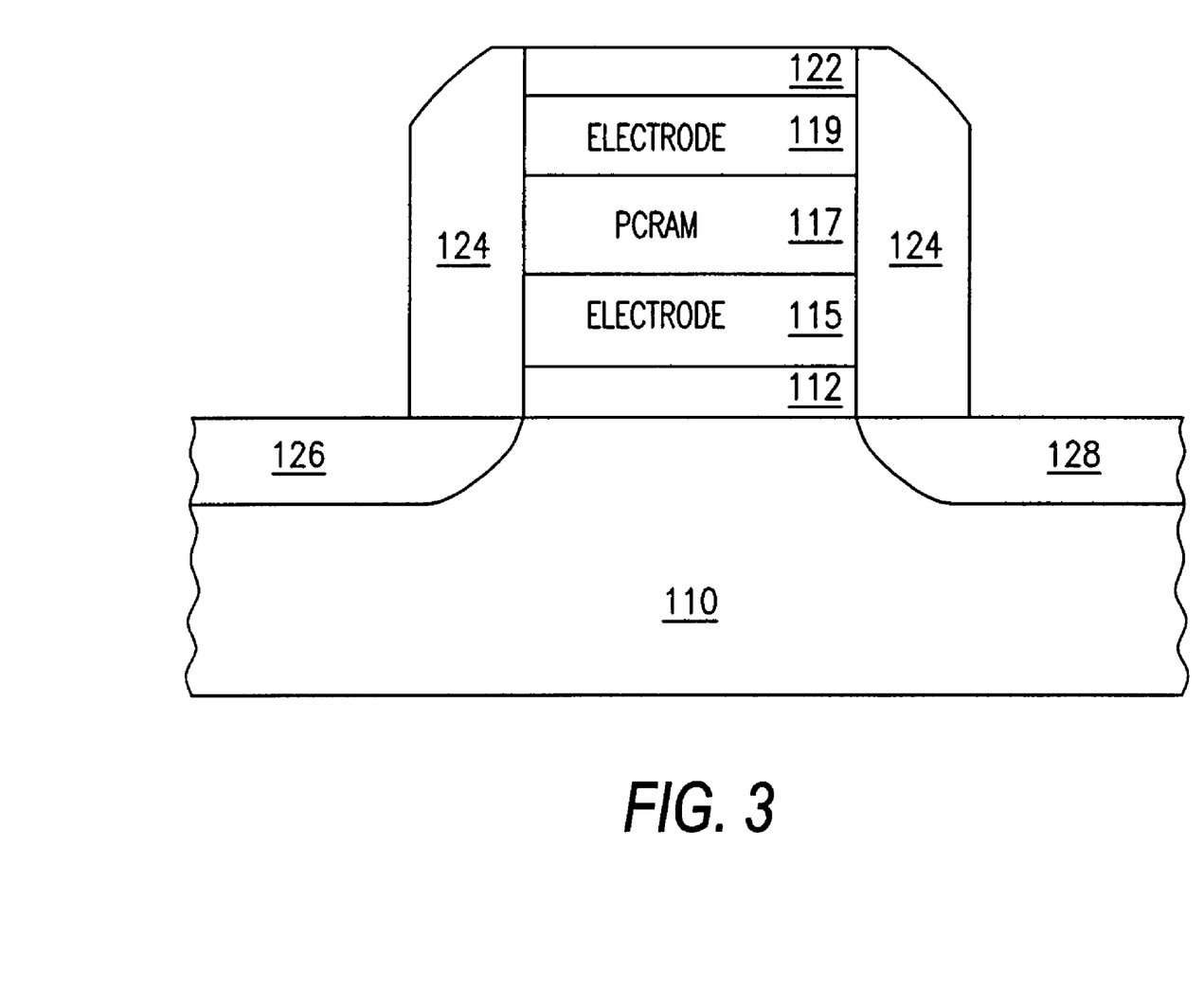
FIG. 3 is an illustration of an embodiment of a flash memory cell of the invention.

Referring now to FIG. 3, there is shown a flash memory cell 100 of an embodiment of the invention. The cell 100 uses a programmable conductance structure 115, 117, 119 to replace the floating gate of the conventional flash memory cell (FIGS. 1-2). Accordingly, a non-polysilicon variable resistance material capable of being switched from a first logic state to a second logic state is provided to promote electron tunneling through a tunnel oxide layer. Unlike a floating gate structure, electrons are not stored to operate the flash memory cell; instead, the programmable conductance structure is switched between resistance states. This results in faster erase times and greater endurance for the cell 100.

The programmable conductance structure 115, 117, 119 includes a programmable conductance in the form of a metal-doped chalcogenide glass disposed between two electrodes (conductive layers). The primary advantage of using a programmable conductance is that programmable conductance structures are not susceptible to the leakage current induced damage experienced by floating gates during erase cycles. Thus, a flash memory device utilizing a variable resistance material including a programmable conductor will have a greater endurance, as measured by the number of times each cell can be rewritten (i.e., erased and written).

Figure 4:
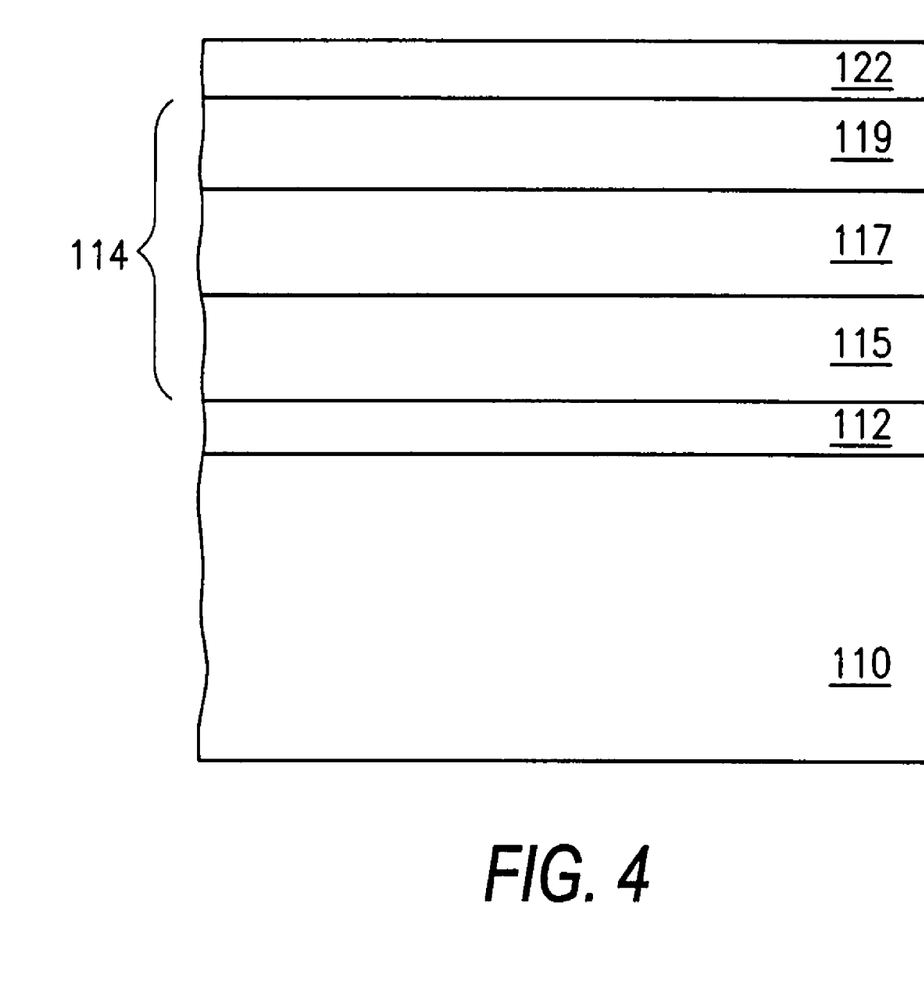
FIGS. 4-5 are cross-section illustrations of a flash memory cell of the invention at various stages of fabrication.
Figure 5:
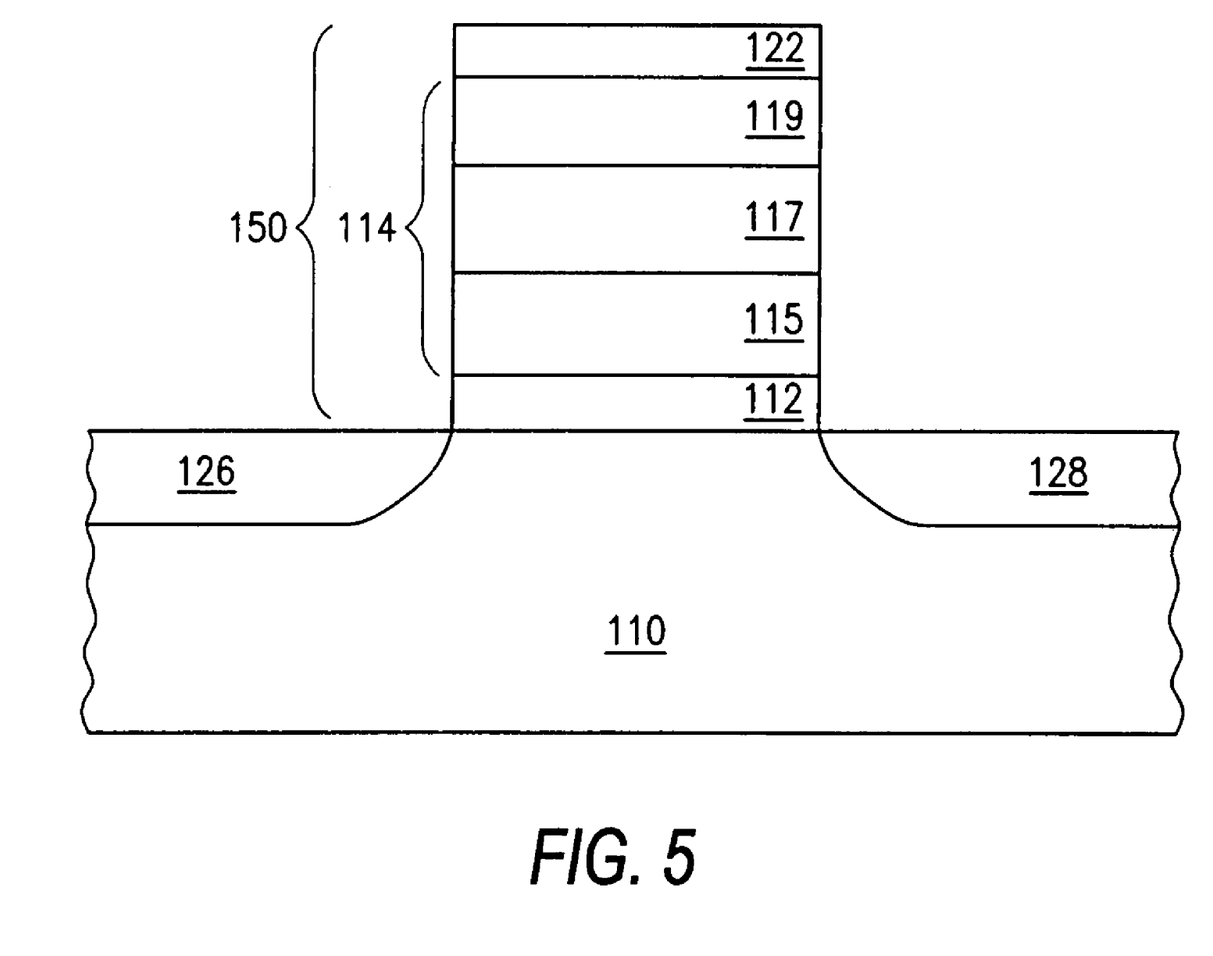

FIGS. 4 and 5 are cross-sectional views of a flash memory cell 100 at various stages of fabrication in accordance with the invention. Referring to FIG. 4, a gate dielectric layer, often referred to as gate oxide layer or a tunnel oxide layer (hereinafter T.O. layer) 112, is formed over a substrate 110, such as a wafer of single crystalline silicon (Si) or other material. The substrate 110 may be implanted with a p-type dopant to produce a p-type substrate.

The tunnel oxide layer 112 comprises a dielectric material, which preferably comprises an oxide material. The oxide may be formed by thermal or other oxidation techniques. Other dielectric materials may be used for the T.O. layer 112. Specific examples include silicon oxides, silicon nitrides and silicon oxynitrides.

The structure 114 of the flash memory cell 100 includes a first electrode 115, a variable resistance material 117, and a second electrode 119 which are formed over the tunnel oxide layer 112. An insulating cap layer 122 is generally formed overlying the second electrode 119.

Although layer 117 is shown as a single material, it should be recognized that layer 117 may itself be comprised of a plurality of layers. For example, in one exemplary embodiment, layer 117 is comprised of a first layer comprising $Ge_{40}Se_{60}$, a second layer (formed over the first layer) comprised of Ag, and/or Se (e.g., the second layer might be a single layer of $Ag_2Se$, or a layer of $Ag_2Se$ formed over a layer of Ag), a third layer formed over the second layer, the third layer comprising $Ge_{40}Se_{60}$, a fourth layer formed over said third layer comprising Ag, and a fifth layer formed over said fourth layer comprising $Ge_{40}Se_{60}$. In one exemplary embodiment, the first and third layer may be about 150 angstrom in thickness, and the fifth layer may be about 100 angstrom in thickness. The fourth layer may be approximately 200 angstrom in thickness. Finally, the second layer may be a 470 angstrom layer of $Ag_2Se$ formed over a 35-50 angstrom layer of Ag.

The first electrode 115 is formed over the tunnel oxide layer 112. The first electrode 115 may comprise any conductive material, for example, tungsten, nickel, tantalum, aluminum, platinum, or silver, among many others.

The variable resistance material 117 is formed over the first electrode 115. One preferred material 117 comprises a chalcogenide glass. A specific example is germanium-selenide ($Ge_xSe_{100-x}$) containing a silver (Ag) component. A preferred germanium-selenide stoichiometric range of the resistance variable material 117 is between about $Ge_{18}Se_{82}$ to about $Ge_{43}Se_{57}$ and is more preferably about $Ge_{20}Se_{80}$.

One method of providing silver to germanium-selenide composition is to initially form a germanium-selenide glass and then deposit a thin layer of silver upon the glass, for example by sputtering, physical vapor deposition, or other known techniques in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped or photodoped with silver. Another method for providing silver to the glass is to provide a layer of silver-selenide on a germanium-selenide glass.

The variable resistance material 117 is generally formed of dielectric material having a conductive material, such as silver, incorporated therein. The resistance of the variable resistance material 117 can be programmed between two bi-stable states having high and low resistances. The variable resistance material 117 is normally in a high resistance state. A write operation placing the material 117 into a low resistance state is performed by applying a voltage potential across the two electrodes 115, 119. A write operation placing the material into a high resistance state is performed by applying a reversed voltage potential across the two electrodes 115, 119. Accordingly the state of the flash memory cell will be determined by the potential applied to the structure 114.

The second conductive electrode 119 is formed over the variable resistance material 117. The second electrode 119 may comprise any electrically conductive material, for example, tungsten, tantalum, titanium, or silver, among many others. Typically, the second electrode 119 comprises silver.

A cap layer 122 is generally formed overlying the structure 114, and in particular, overlying the second electrode 119, to act as an insulator and barrier layer. The cap layer 122 contains an insulator and may include such insulators as silicon oxide, silicon nitride, and silicon oxynitrides. Preferably, the cap layer 122 is a silicon nitride, formed by such methods as chemical vapor deposition (CVD). An example of the resulting structure is depicted in FIG. 3.

In FIG. 5, the tunnel oxide layer 112, the first electrode 115, the variable resistance material 117, second electrode 119, and the cap layer 122 illustrated in FIG. 4 are patterned to define the gate 150. It is noted that additional layers may form the gate 150, such as barrier layers to inhibit diffusion between opposing layers of adhesion layers to promote adhesion between opposing layers.

Figure 6:
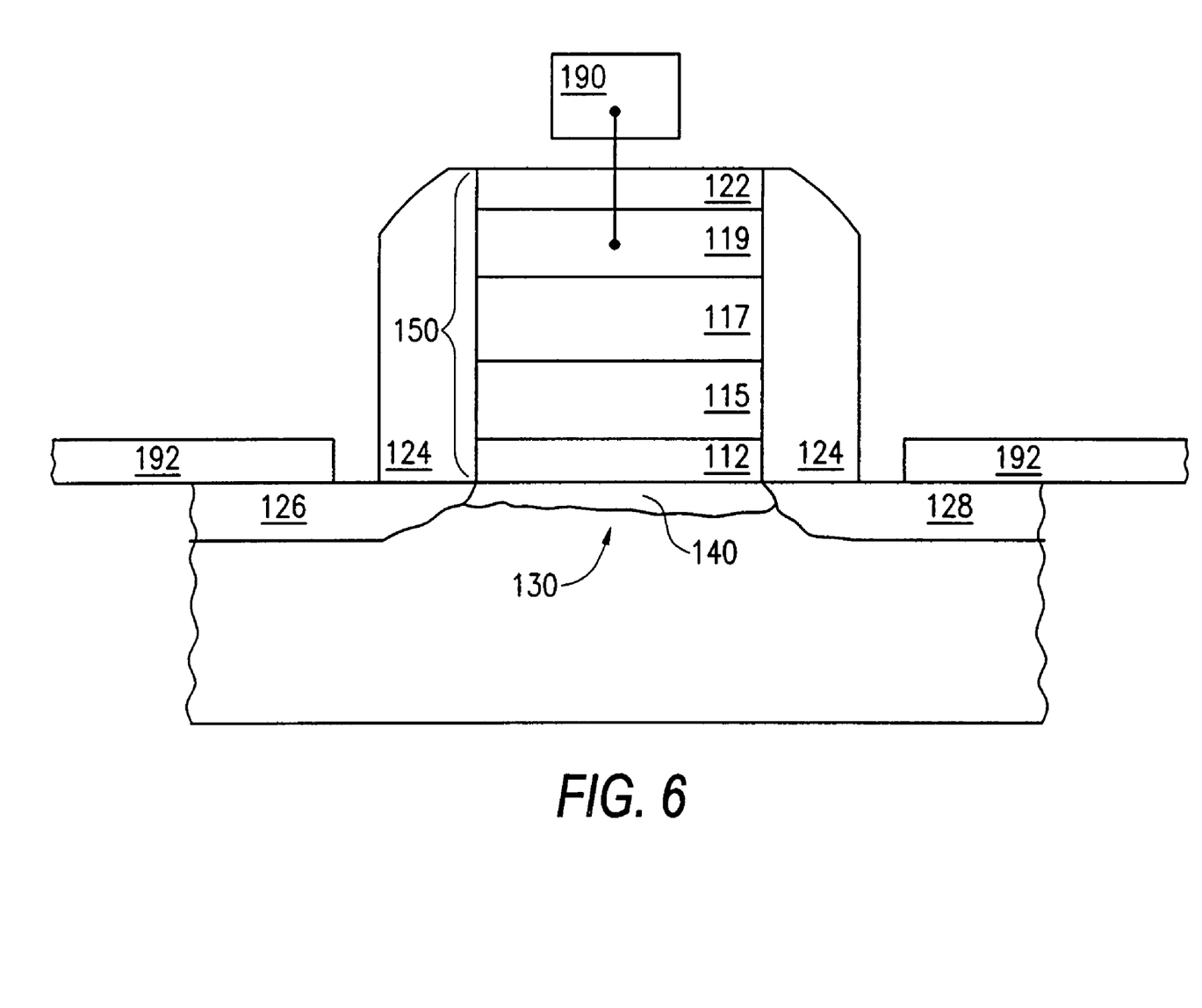
FIG. 6 is an illustration of the flash memory cell of the invention coupled to a word line and a bit line.

A source region 126 and a drain region 128 are formed adjacent to the gate 150 as conductive regions having a second conductivity type different than the conductivity type of the substrate 110. For example, the source and drain regions 126 and 128 are n-type regions formed by implantation and/or diffusion or n-type dopants, such as arsenic or phosphorus. The edges of the source and drain regions 126 and 128 are generally made to coincide with, or underlap, the gate edges. As an example, the source and drain regions 126 and 128 may be formed using light doped regions, as known in the art. Referring to FIG. 6, at least the second electrode 119 of the gate 150 is coupled to a word line 190. The source 126 and drain 128 are coupled to respective bit lines 192.

The sidewalls of the gate 150 are insulated using sidewall spacers 124 as shown in FIG. 3. The sidewall spacers 124 contain an insulator and may include the same materials as the cap layer 122. The sidewall spacers 124 are typically formed by blanket deposition an insulating layer, such as a layer of silicon nitride, over the entire structure and then anisotropically etching the insulating layer to preferentially remove the horizontal regions and to leave only the vertical regions adjacent the sidewalls of the gate 150.

Figure 7:
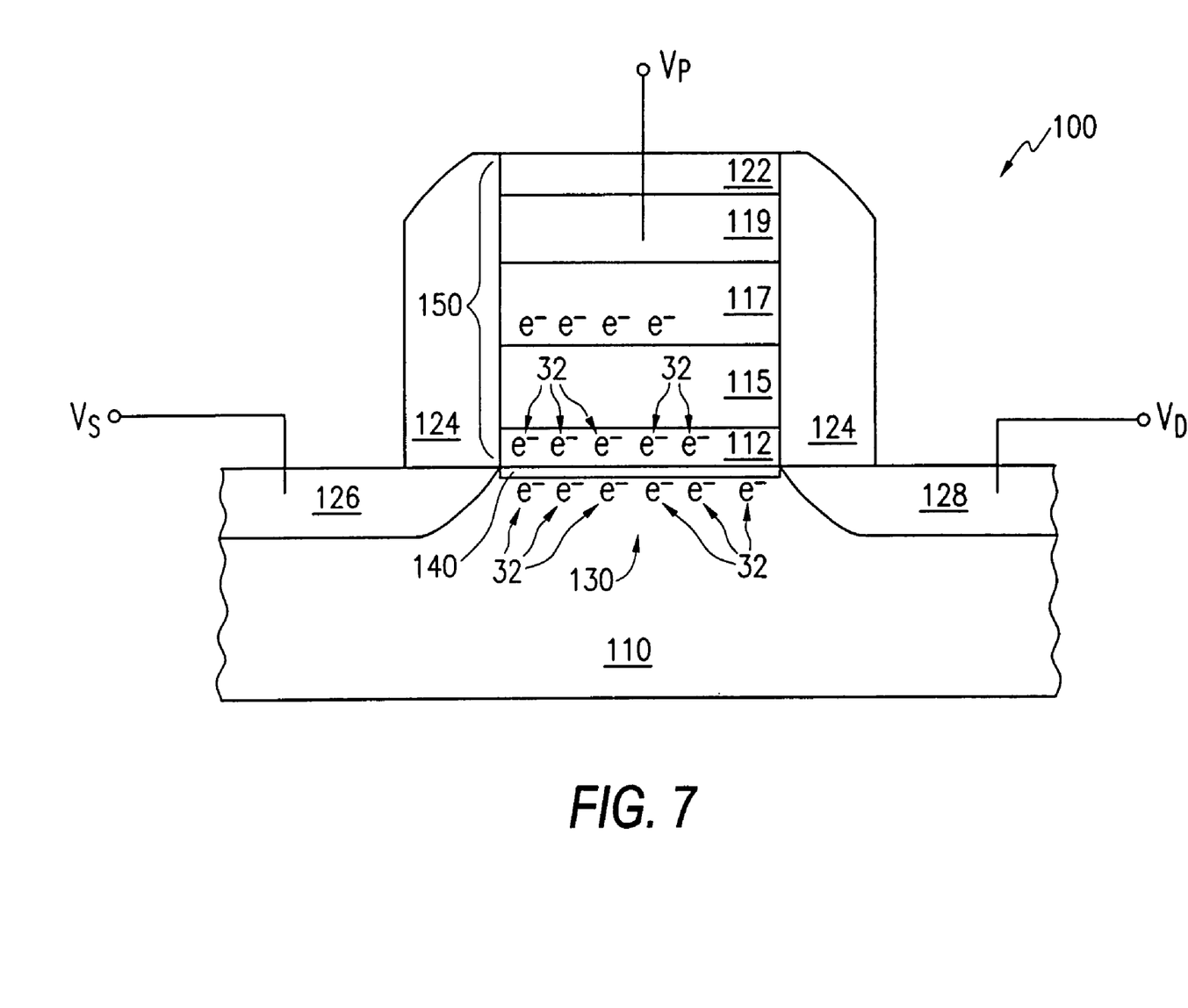
FIG. 7 is an illustration of how the flash memory cell of an embodiment of the invention may be programmed.

Referring now to FIG. 7, to write (i.e., program) the memory cell 100, a positive programming voltage Vp of about 8 volts to 12 volts is applied to the second electrode 119. This positive programming voltage Vp attracts electrons 132 from p-type substrate 110 and causes them to accumulate toward the surface of channel region 130. A drain 128 voltage Vd is increased to about 6 volts, and the source 126 is connected to ground. As the drain-to-source voltage increase, electrons 132 begin to flow from the source 126 to the drain 128 via channel region 130. The electrons 132 acquire substantially large kinetic energy and are referred to as hot electrons.

The voltage difference between the second electrode 119 and drain 128 creates an electric field through the tunnel oxide layer 112, this electric field attracts the hot electrons 132 and accelerates them towards the first electrode 115. The first electrode 115 starts to trap and accumulate the hot electrons 132, beginning the charging process. As the charge on the first electrode 115 increase, the electric field through tunnel oxide layer 112 decrease and eventually loses it capability of attracting any more of the hot electrons. At this point, the first electrode 115 has sufficient charge, such that the voltage potential across the two electrodes causes a conductive path to form across the variable resistance material 117 from the second electrode 119 to the first electrode 115. A threshold voltage Vt of the memory cells is equivalent to the voltage potential across the two electrodes which causes the conductive path to form. Since the typical non-programmed state of a variable resistance material 117 is the high resistance state (e.g., logical "0"), the memory element is programmed by an applied voltage to place the memory element into a low resistance state (e.g., logical "1"). The resistance between the two electrodes 115, 119 of the cell thus becomes a function of the presence or absence of a conductive path in the cell 100.

The memory cell 100 may be erased using Fowler-Nordheim (FN) tunneling. More specifically, the drain 128 is electrically floated, the source 126 is grounded, and a high negative voltage (e.g., about −12 volts) is applied to the second electrode 119. This creates an electric field across the tunnel oxide layer 112 and forces electrons 132 off of the first electrode 115 which then tunnel through the tunnel oxide layer 112 to the source region 126. Additionally, the conductive path begins to retract, which in turn increases the resistance of the memory cell 100 to coincide with the high resistance state (e.g., logical "0").

A read operation is performed by sensing a difference caused by the memory cell 100 being in a first programmed state (e.g., logical "1") or a second programmed state (e.g., logical "0"). Referring now to FIG. 7, a read operation can be started by applying a reading voltage to the second electrode 119. The reading voltage is chosen so that when the memory cell 100 is in the first programmed state, an inversion layer 140 is formed in the channel region 130 below the tunnel oxide layer 112, and when the memory cell 100 is in the second programmed state, no inversion layer 140 is formed. The inversion layer 140 can be thought of as an extension of the source/drain regions 126/128 into the channel region 130. As discussed below, the presence or absence of an inversion layer 140 can be used to cause a difference in bit line capacitance or current flow through the cell 100.

A memory cell 100 in the first programmed state (and thus having an inversion layer 140) would have a greater bit line capacitance than the same memory cell 100 in the second programmed state (not having an inversion layer 140). The increase in capacitance in the first programmed state is due to the inversion layer 140 coupling an additional source/drain junction in the memory cell 100. Similarly, if a small (e.g., about 0.3-0.8 volt) forward bias is applied to the target bit line, a memory cell 100 in the first programmed state (and having an inversion layer) would have a higher level of forward current flow through the bit line than the same memory cell 100 in the second programmed state (and not having an inversion layer). The increase in current flow in the first programmed state is due to the inversion layer 140 creating a larger a larger effective diode area for the bit line forward current through the memory cell 100.

The memory cell 100 can then be read by conventionally sensing the above described differences between the two programmed states. For example, a sensing scheme may include precharging a target bit line and a reference bit line to respective reference levels, coupling the target bit line to the memory cell 100 while the reading voltage is on, and sensing a difference in voltage between said target bit line and said reference bit line after a predetermined time.

Figure 8:
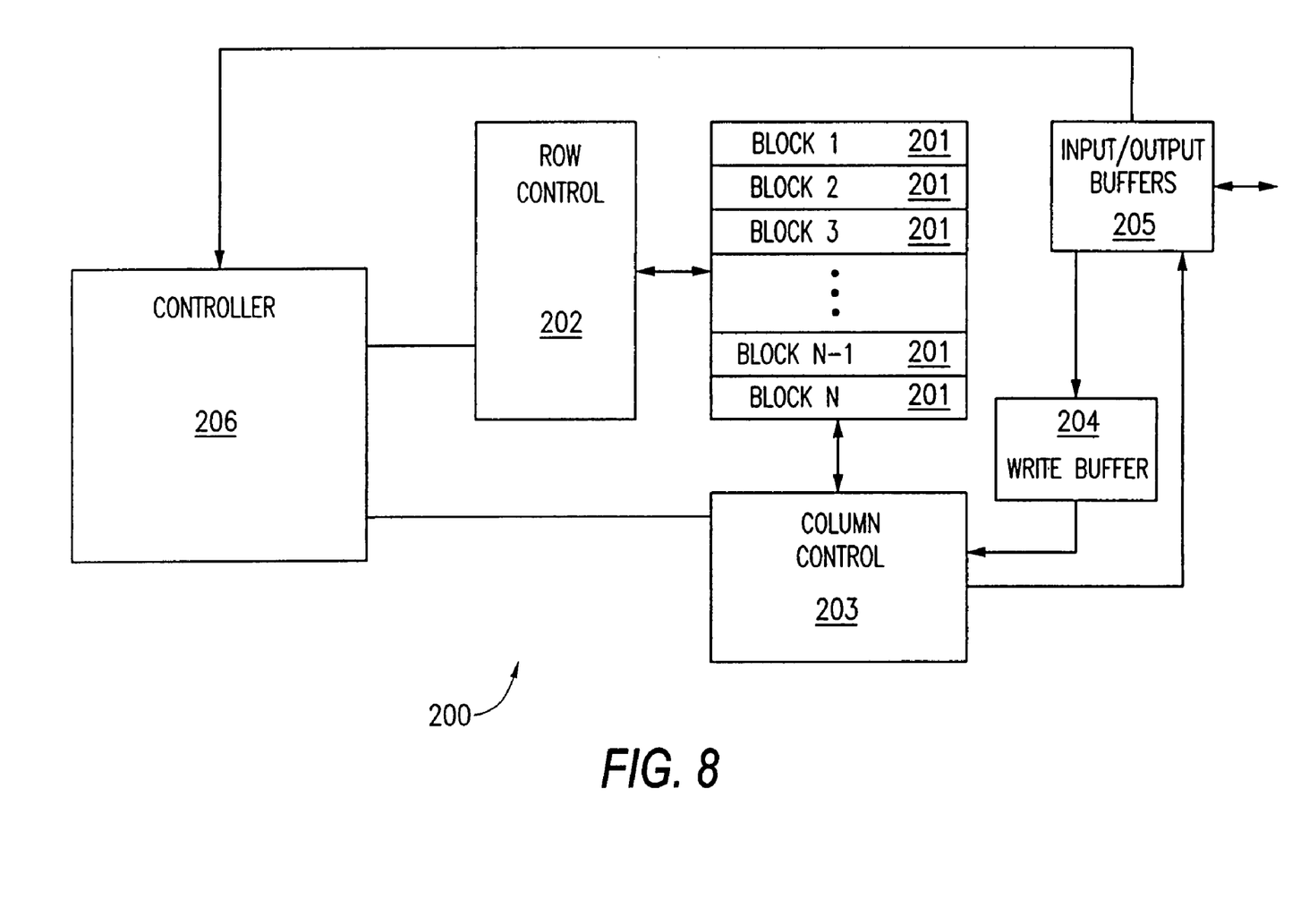
FIG. 8 is an illustration of a flash memory device incorporating the flash memory cell of an embodiment of the invention.

FIG. 8 is an illustration of flash memory device 200. The flash memory device 200 includes a plurality of individually erasable blocks 201. Each block 201 includes a plurality of flash memory cells 100 (FIG. 3). The blocks 201 are coupled to a row control circuit 202 and a column control circuit 203, for addressing and controlling reading, writing, and erasing of one or more memory cells 100 (FIG. 3) of a selected block 201. The column control circuit 203 is also coupled to a write buffer 204, which holds data to be written and to input/output buffers 205 for buffering off-device communications. A controller 206, coupled to the row control circuit 202, column control circuit 203, and input/output buffers 205, coordinates the reading, writing, and erasing of the device 200.

Figure 9:
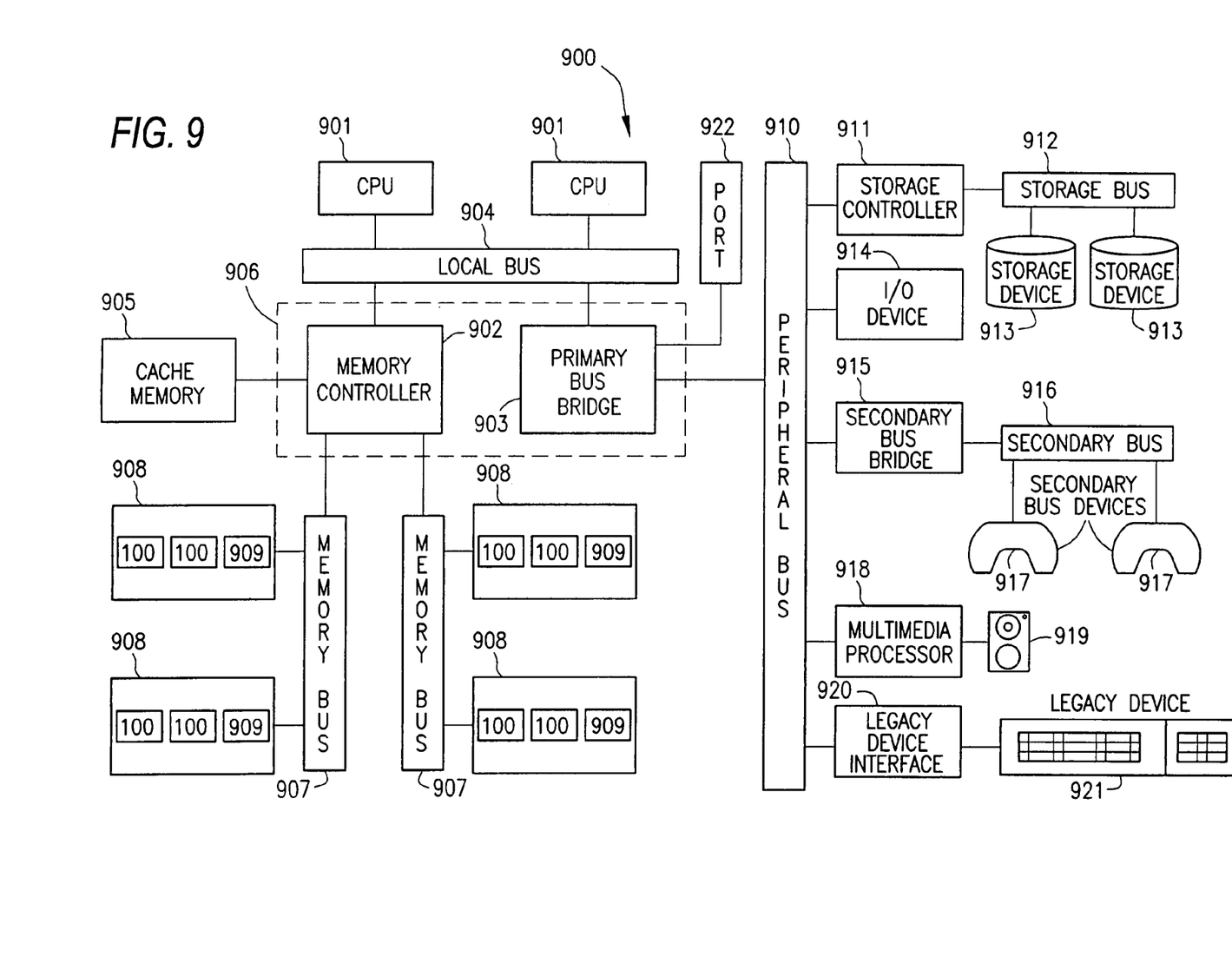
FIG. 9 is an illustration of a computer system incorporating the flash memory device of FIG. 8.

FIG. 9 illustrates an exemplary processing system 900 which may utilize the memory device 200 of the present invention. The memory device 200 may be found, for example, in a memory component 908 of the system 900. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 200 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge 915 may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple at least one legacy device 921, for example, older styled keyboards and mice, to the processing system 900.

The processing system 900 illustrated in FIG. 9 is only an exemplary processing system with which the invention may be used while FIG. 9 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A memory cell, comprising:
   a substrate, said substrate including a source region and a drain region;
   a first insulating layer over said substrate;
   a first conductive layer and a second conductive layer over said first insulating layer and between said source and drain regions;
   a programmable conductance element formed between said first and second conductive layers, said programmable conductance element having a resistance which is controllable between at least two states.

2. The memory cell of claim 1, wherein said programmable conductance element is comprised of a chalcogenide glass.

3. The memory cell of claim 2, wherein said chalcogenide glass is comprised of germanium-selenide.

4. The memory cell of claim 2, wherein said chalcogenide glass comprises $Ge_xSe_{100-x}$.

5. The memory cell of claim 4, wherein x has a range of from 18 to 43.

6. The memory cell of claim 5, wherein x is 20.

7. The memory cell of claim 2, wherein said chalcogenide glass is doped with a metal.

8. The memory cell of claim 2, wherein said chalcogenide glass is doped with silver.

9. The memory cell of claim 1, wherein said first and second conductive layers are comprised of one of tungsten, nickel, tantalum, aluminum, platinum, and silver.

10. The memory cell of claim 1, wherein said programmable conductance element is a multi-layer structure comprised of:
first and second layers comprising $Ge_{40}Se_{60}$;
a third layer, formed between said first and second layers, said third layer comprising,
at least one of,
a sublayer of Ag, and
a sublayer of $Ag_2Se$;
a fourth layer, formed between said second and third layers, comprised of $Ge_{40}Se_{60}$;
a fifth layer, formed between said second and fourth layers, comprising Ag.

11. A memory device, comprising:
a control circuit;
a memory array, coupled to said control circuit, said memory array further comprising a plurality of blocks, each of said plurality of blocks including a plurality of memory cells,
wherein each of said memory cells comprises,
a substrate, the substrate having a source region and a drain region;
a first insulating layer over said substrate;
a first conductive layer and a second conductive layer over said first insulating layer and between said source and drain regions;
a programmable conductance element formed between said first and second conductive layers, said programmable conductance element having a resistance which is controllable between at least two states.

12. The device of claim 11, wherein said programmable conductance element is comprised of a chalcogenide glass.

13. The device of claim 12, wherein said chalcogenide glass is comprised of germanium-selenide.

14. The device of claim 12, wherein said chalcogenide glass is comprised of $Ge_xSe_{100-x}$.

15. The device of claim 14, wherein x has a range of 18 to 43.

16. The device of claim 15, wherein x is 20.

17. The device of claim 11, wherein said chalcogenide glass is doped with a metal.

18. The device of claim 11, wherein said chalcogenide glass is doped with silver.

19. The device of claim 11, wherein said first and second conductive layers are comprised of one of tungsten, nickel, tantalum, aluminum, platinum, and silver.

20. The memory cell of claim 11, wherein said programmable conductance element is a multi-layer structure comprised of:
first and second layers comprising $Ge_{40}Se_{60}$;
a third layer, formed between said first and second layers, said third layer comprising,
at least one of,
a sublayer of Ag, and
a sublayer of $Ag_2Se$;
a fourth layer, formed between said second and third layers, comprised of $Ge_{40}Se_{60}$;
a fifth layer, formed between said second and fourth layers, comprising Ag.

21. A processor based system, comprising:
a processor;
a memory device, said memory device including a plurality of memory cells,
wherein each of said memory cells comprises,
a substrate, the substrate having a source region and a drain region;
a first insulating layer over said substrate;
a first conductive layer and a second conductive layer over said first insulating layer and between said source and drain regions;
a programmable conductance element formed between said first and second conductive layers, said programmable conductance element having a resistance which is controllable between at least two states.

22. The device of claim 21, wherein said programmable conductance element is comprised of a chalcogenide glass.

23. The device of claim 22, wherein said chalcogenide glass is comprised of germanium-selenide.

24. The device of claim 22, wherein said chalcogenide glass has a chemical formula of $Ge_xSe_{100-x}$.

25. The device of claim 24, wherein x has a range of 18 to 43.

26. The device of claim 25, wherein x is 20.

27. The device of claim 22, wherein said chalcogenide glass is doped with a metal.

28. The device of claim 22, wherein said chalcogenide glass is doped with silver.

29. The device of claim 21, wherein said first and second conductive layers are comprised of one of tungsten, nickel, tantalum, aluminum, platinum, and silver.

30. The system of claim 21, wherein said programmable conductance element is a multi-layer structure comprised of:
first and second layers comprising $Ge_{40}Se_{60}$;
a third layer, formed between said first and second layers, said third layer comprising,
at least one of,
a sublayer of Ag, and
a sublayer of $Ag_2Se$;
a fourth layer, formed between said second and third layers, comprised of $Ge_{40}Se_{60}$;
a fifth layer, formed between said second and fourth layers, comprising Ag.

* * * * *